United States Patent [19]
Mallon

[11] 3,964,087
[45] June 15, 1976

[54] RESISTOR NETWORK FOR INTEGRATED CIRCUIT

[75] Inventor: Marvin C. Mallon, Canoga Park, Calif.

[73] Assignee: Interdyne Company, Van Nuys, Calif.

[22] Filed: May 15, 1975

[21] Appl. No.: 577,725

[52] U.S. Cl. ............................ 338/306; 174/68.5; 338/308; 338/325; 338/333; 339/17 C
[51] Int. Cl.² .......................................... H01C 7/00
[58] Field of Search ...................... 338/306–309, 338/312, 313, 324, 325, 328, 333; 339/17 CF, 17 LC, 17 C, 22 B; 317/101 CC; 174/68.5

[56] References Cited
UNITED STATES PATENTS

| | | |
|---|---|---|
| 2,407,251 | 9/1946 | Christensen ........................ 338/325 |
| 2,629,166 | 2/1953 | Marsten et al. ................. 338/309 X |
| 3,185,947 | 5/1965 | Freymodsson ................. 338/308 X |
| 3,891,898 | 6/1975 | Damon ......................... 339/17 CF |

*Primary Examiner*—C. L. Albritton
*Attorney, Agent, or Firm*—William W. Haefliger

[57] ABSTRACT

An electrical resistance package comprises:
a. an insulative substrate,
b. a network in film form on the substrate, the network including resistance branches,
c. there being terminals on the substrate and associated with the respective branches for registration with contact pins, whereby the resistance branch may be selectively electrically connected via said terminals with the pins in registration therewith.

14 Claims, 9 Drawing Figures

RESISTOR NETWORK FOR INTEGRATED CIRCUIT

BACKGROUND OF THE INVENTION

This invention relates generally to resistor networks, and more particularly concerns the provision of electrical resistance network packages especially useful in integrated circuit applications, and affording many advantages over existing devices.

In current high density wiring and integrated circuitry applications there is continuing need for reduction in required circuit board space and assembly time. In this regard, there is great need for multiple resistor components capable of rapid and reliable electrical connection to closely spaced contact pins. None of the devices of this nature with which I am familiar embody the unusual advantages in construction, mode of assembly and result as are now afforded by the present multiple resistance package.

SUMMARY OF THE INVENTION

It is a major object of the invention to provide a resistor network package affording greater packaging density, minimizing of electrical lead lengths, minimum conductor length dimensions from the voltage source to the resistors in the package, no requirements for additional sockets, wires or holes in a circuit board, and significant assembly and installation cost reduction. Basically, the package comprises:
a. an insulative substrate,
b. a network in film form on the substrate, the network including resistance branches,
c. there being terminals on the substrate and associated with the respective branches for registration with contact pins, whereby the resistance braches may be selectively electrically connected via said terminals with the pins in registration therewith.

As will appear, the network typically includes a bus on the substrate to which the branches are electrically connected, and the terminals are located at the ends of the branches remote from the bus; further, the terminals typically comprise electrically conductive C-shaped pads opening directionally away from the bus. The pad construction is such, in relation to edge notches in the substrate, as to enable at least partial reception of the pins in the pad openings and notches, the pins projecting normal to the plane of the substrate. Solder connection of the pins to the pads may then be made via washers assembled on the pins to overlie the pads.

Other objects include the location of the pins in two rows to confine the substrate therebetween; the provision of an additional and voltage supply pin penetrating the substrate and bus, centrally of the latter; and the provision of a socket carrying the pin and substrate, and the provision of wire wrappings on the pins.

These and other objects and advantages of the invention, as well as the details of illustrative embodiments, will be more fully understood from the following description and drawings, in which:

DRAWING DESCRIPTION

DETAILED DESCRIPTION

Figure 1:
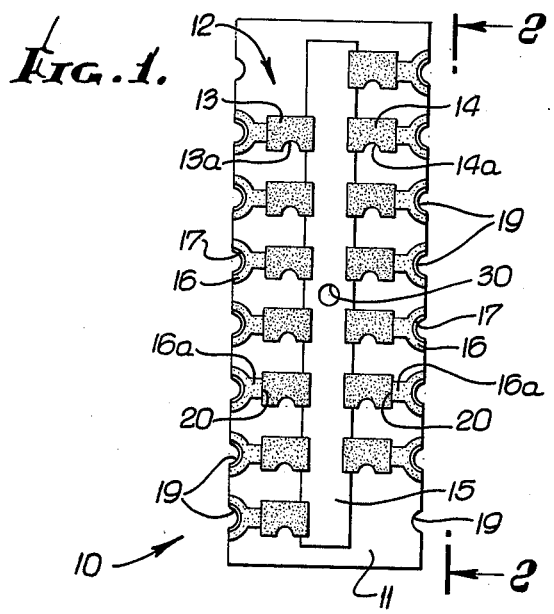
FIG. 1 is a plan view of resistance package incorporating the invention.
Figure 2:
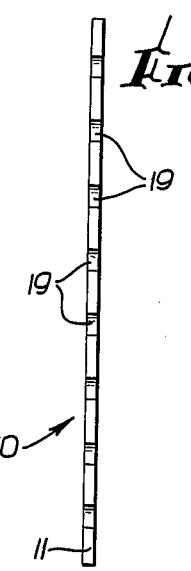
FIG. 2 is an edge view of the FIG. 1 package, taken on lines 2—2 of FIG. 1.

Referring first to FIGS. 1 and 2, an electrical resistance package as at 10 comprises an insulative substrate, exemplified by thin rectangular body 11, and an electrical resistance network in film form on the substrate. The illustrated network 12 includes laterally extending branches 13 and 14 at opposite sides of and normal to a longitudinally extending bus strip 15. Substrate body 11 may consist of a suitable ceramic, and the resistors 13 and 14 may comprise thick-film resistors permanently fired in place. Eash resistor may for example have precisely the correct value required as a line terminator for ECL devices, and for this purpose the resistors may be "trimmed" as by laser or abrasive formed edge notches indicated at 13a and 14a. Bus 15 may comprise a conductive metallic foil or film to which inner ends of the resistive branches are electrically and mechanically connected.

Figure 4:
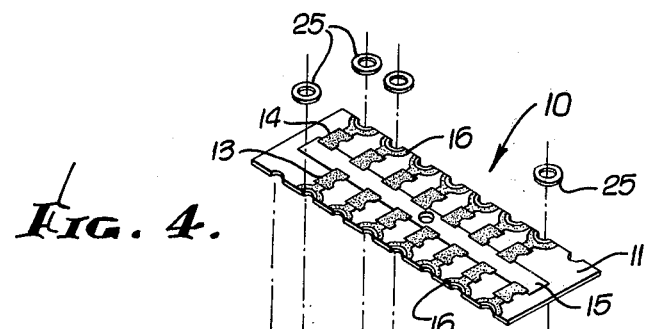
FIG. 4 is an exploded perspective showing use of the FIG. 1 package.
Figure 5:
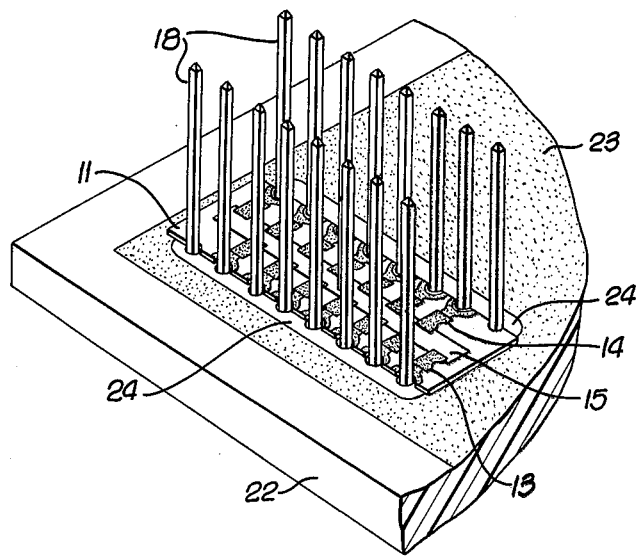
FIG. 5 is a view like FIG. 4, but with the components in assembled condition.

The package also includes terminals on the substrate and associated with the respective resistive branches for registration with contact pins, whereby the branches may be electrically connected via the terminals with the pins in registration therewith. In the example, the terminals comprise electrically conductive C-shaped pads 16 opening directionally away from the bus 15 and at the ends of the branches 13 and 14 remote from the bus. The openings 17 formed by the pads are sized to receive the pins 18, which typically project perpendicular to the plane of the substrate; further, the substrate itself typically forms edge notches 19 in registration with and corresponding to the pad openings 17, whereby the pins project through both the notches and openings. Tolerances are loose, and the package 10 may easily be fitted between two rows of such pins, as is seen in FIGS. 4 and 5, due to the provision of the laterally exposed openings 17 and notches 19 as described. Pads 16 may consist of metal foil or film, and are electrically connected via inner ends 20 of arms 16a to resistive branches 13 and 14, as is clear from FIGS. 1, 6 and 9.

Figure 6:
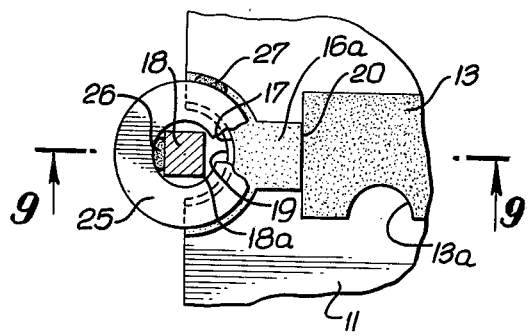
FIG. 6 is an enlarged fragmentary plan view, showing electrical interconnection between a terminal pin and an edge pad of the package.

Extending the description to FIGS. 4 and 5, two rows of pins are shown confining the substrate therebetween, as by reception in the pad openings in the manner further shown in FIG. 6. The pins may project normal to the plane of the substrate and through a carrier 22 which mounts the substrate as seen in FIG. 5. The surface of the carrier may have an electrically conductive coating 23 thereon serving as a ground on which the underside of substrate body 11 rests; however, the coating 23 is spaced from the pins 18, as at zones 24.

Figure 9:
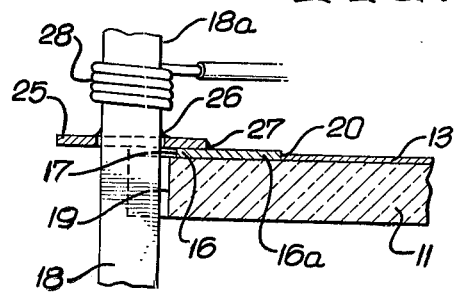
FIG. 9 is a section on lines 9—9 of FIG. 6.

Means to electrically connect selected pins to selected pads may with unusual advantage take the form of washers 25 received endwise over the pins to closely overlie the pads, in the manner illustrated in FIGS. 6 and 9. The washers may then have soldered connections as at 26 and 27 to the pins and pads, such connections also serving to mechanically locate the package 10 relative to the pins and carrier. Further, the pins may have polygonal cross sections, as for example square, to provide edges 18a offering good electromechanical contact with wire wrappings 28 which may be applied thereabout. Of unusual advantage for use in this regard are the pins described and shown in U.S. Pat. No. 3,824,557 to Marvin C. Mallon. The pins may have receptacle type heads as indicated at 95 in FIG. 4.

Figure 3:
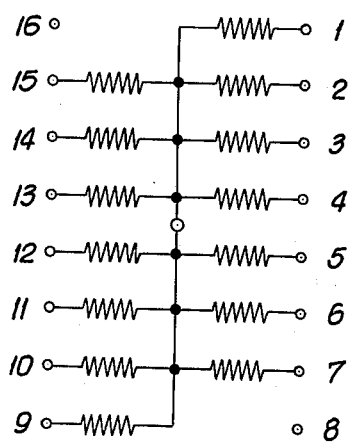
FIG. 3 is an equivalent resistance diagram of the FIG. 1 resistance package.

Additional registered openings are typically formed through the bus and substrate, as at 30 in FIG. 1, to receive an additional pin connectible to a voltage source. One such additional pin is seen at 18' in FIG. 4. FIG. 3 shows the equivalent electrical circuit arrangement of the bus, resistance branches and terminals embodied in package 10.

Figure 7:
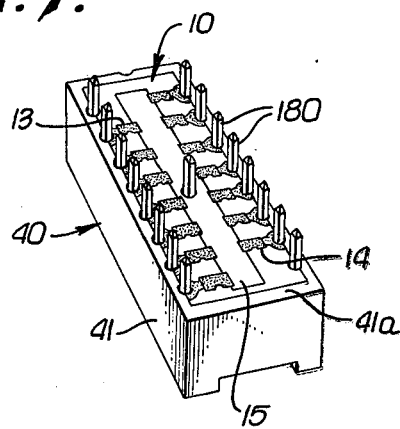
FIG. 7 is a perspective view showing use of the FIG. 1 package on a socket.
Figure 8:
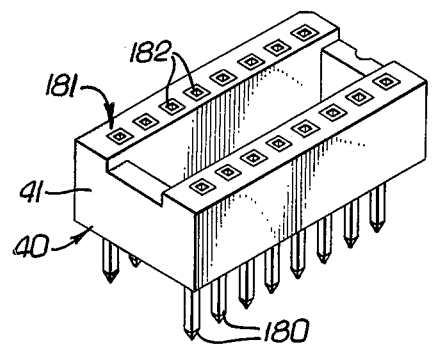
FIG. 8 is a perspective view showing the underside of the FIG. 7 socket.

Finally, FIGS. 7 and 8 illustrate the incorporation of the package 10 with a socket 40. The pins 180 project at the side 41a of the socket body at which the substrate 10 is mounted. The pins include receptacle type heads 181 defining openings 182 to receive other contacts, and the heads are exposed at the opposite side of the socket body. Typically, the heads may be received into the body 41, as appears in FIG. 8.

I claim:
1. An electrical resistance package comprising
   a. an insulative substrate,
   b. a network in film form on the substrate, the network including resistance branches,
   c. there being terminals on the substrate and associated with the respective branches for registration with contact pins, whereby the resistance branches may be selectively electrically connected via said terminals with the pins in registration therewith, said terminals comprising electrically conductive pads located at the ends of the branches, the substrate forming edge notches to receive the pins and each pad extending proximate a notch edge but everywhere offset therefrom away from the notch edge so as to remain out of direct contact with the pin in the notch, whereby means may be received on selected pins to closely overlie selected pads and to have soldered connections to the selected pins and pads.

2. The package of claim 1 wherein said network includes a bus on the substrate and to which said branches are electrically connected.

3. The package of claim 2 wherein the bus extends generally longitudinally on the surface of the substrate, and the branches extend generally laterally from the bus.

4. The package of claim 2 wherein said terminals are located at the ends of the branches remote from the bus, and form openings to receive the pins.

5. The package of claim 4 wherein said terminals comprise electrically conductive C-shaped pads opening directionally away from the bus.

6. The package of claim 5 wherein said pads are located at the edge of the substrate, the substrate edge notches being in registration with said pad openings.

7. The package of claim 5 including pins received by said pad openings, and said means electrically connecting selected pins and pads.

8. The package of claim 5 wherein said means comprises washers on the selected pins and overlying the selected pads, the washers having soldered connections to selected pins and pads.

9. The package of claim 4 including a socket having a body carrying the substrate, and including said pins which are received through said openings.

10. The package of claim 9 wherein the pins include heads defining openings to receive other contacts, the heads exposed at the side of the socket body opposite said substrate.

11. The package of claim 9 including wire wrappings on certain of said pins.

12. The package of claim 10 wherein the socket carries said pins.

13. The package of claim 2 including additional registered openings through the bus and the substrate to receive an additional pin connectible with a voltage source.

14. The package of claim 2 including two longitudinal rows of said pins proximate laterally opposite edges of said substrate, the rows of pins confining the substrate therebetween, the pins electrically connected with the terminals.

* * * * *